United States Patent [19]

Hishiki

[11] Patent Number: 4,912,426
[45] Date of Patent: Mar. 27, 1990

[54] AMPLIFIER CIRCUIT
[75] Inventor: Yuji Hishiki, Tokyo, Japan
[73] Assignee: Seiko Instruments Inc., Japan
[21] Appl. No.: 269,438
[22] Filed: Nov. 9, 1988
[51] Int. Cl.[4] .............................................. H03F 3/45
[52] U.S. Cl. ...................................... 330/253; 330/51;
                                                            379/324
[58] Field of Search ................... 330/51, 253; 307/549,
                                                307/550, 568; 379/324

[56] References Cited
U.S. PATENT DOCUMENTS
4,546,327 10/1985 Suzuki et al. ...................... 330/51 X Primary Examiner—James B. Mullins
Attorney, Agent, or Firm—Bruce L. Adams; Van C. Wilks

[57] ABSTRACT

The amplifier circuit is arranged such that an open drain type amplifying circuit is provided on the side of output of a differential amplifying circuit having an active load. In this arrangement, the differential amplifying circuit is brought into a non-operational state, and at the same moment an electric potential of output of the differential amplifying circuit is fixedly set to a predetermined level. Consequently, the open drain type amplifying circuit is surely kept in the non-operational state.

4 Claims, 1 Drawing Sheet

AMPLIFIER CIRCUIT

BACKGROUND OF THE INVENTION

The present invention relates to an amplifier circuit capable of arbitrarily turning ON/OFF an input signal.

In the case of outputting a DTMF signal generated in a telephone to a line, a buffer amplifier circuit depicted in FIG. 2 has heretofore been used. The buffer amplifier circuit comprises: a differential amplifying unit D including a pair of N-channel type transistors 3 and 4 and a pair of P-channel type transistors 1 and 2 which are, as depicted in the figure, connected in a current-mirror form and provided as an active load on the side of a drain circuit of the transistors 3 and 4; and a P-channel type transistor 6 which is connected to a drain of the transistor 3 and constitutes an open drain type driver circuit. Based on this construction, the DTMF signal applied between the differential input terminals 8 and 9 of the differential amplifying unit D, which are connected to gates of the transistors 3 and 4, is fetched by an outside resistor 12 connected between an output terminal 11 of the driver circuit and a power supply −V. Note that a capacitor 7 is provided as an element for preventing oscillation.

Now, the output of the DTMF signal is required for a limitative short momentary period of time, i.e., during the dialing operation in a telephone system. The operation can be effected by supplying the differential amplifying unit D with a driving electric current only for such a desired period, and hence there is provided an N-channel type transistor 5 functioning as a switching element between the power supply −V and sources of the transistors 3 and 4. The arrangement adopted is such that a conductive state of the transistor 5 is controlled in accordance with a level of a control voltage signal C inputted from a control input terminal 10.

The control voltage signal C is outputted in association with the generation of the DTMF signal, and assumes earth or ground level (an "H" state) only when the transmission of the DTMF signal to the outside is needed. The differential amplifying unit D is caused to come into the operational state by making the transistor 5 conductive. On the other hand, if there is no necessity to output the DTMF signal, the control voltage signal C assumes the level of the power supply voltage −V (an "L" state). The transistor 5 is turned OFF, thus hindering a flow of electric current into the differential amplifying unit D. As a result, consumption of electric power is reduced.

In the conventional circuit described above in conjunction with FIG. 2, when turning OFF the transistor 5, the electric potential of the drain of the transistor 3 increases, thereby holding an OFF-state of the transistor 6 of the driver circuit. In the case of an active load type, however, the voltage of the drain of the transistor 3 is not increased up to earth or ground electric potential because of a threshold voltage of the transistor 2. Instead, a floating state is created, and it follows that the electric potential output of the open drain type driver circuit fluctuates. This causes a malfunction of a device or a circuit connected to the output of the buffer amplifier circuit.

SUMMARY OF THE INVENTION

It is a primary object of the present invention to provide an improved amplifier circuit which is free from the electric potential fluctuations caused by the driver circuit therein.

An amplifier circuit according to the present invention comprises: a differential amplifying unit having an active load; an open drain type driver circuit functioning in response to an output from the differential amplifying unit; and a switching element provided between the differential amplifying unit and a power supply, the switching element being turned ON/OFF so as to switch ON and OFF the operating current supplied to the differential amplifying unit. The amplifier circuit further includes a means for clamping an input level of the driver circuit to a predetermined level in association with the ON/OFF operation of the switching element.

BRIEF DESCRIPTION OF TH DRAWING

DETAILED DESCRIPTION OF PREFERRED EMBODIMENTS

One illustrative embodiment of the present invention will hereinafter be described in greater detail.

Figure 1:
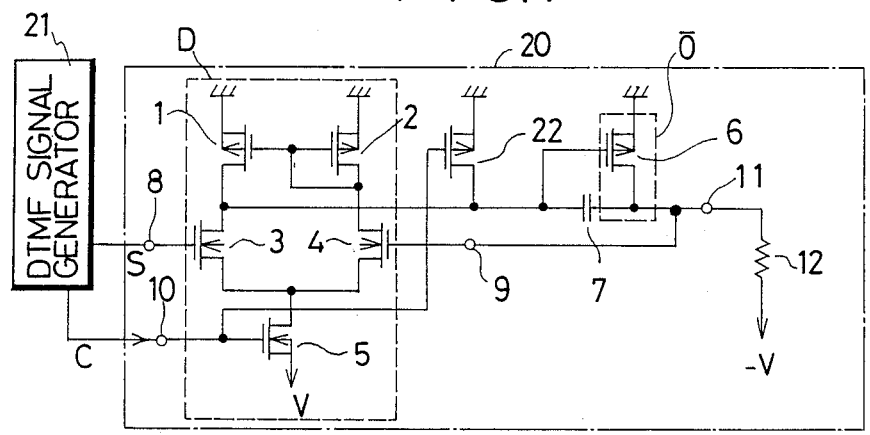
FIG. 1 is a circuit diagram illustrating one embodiment of an amplifier circuit according to the present invention.
Figure 2:
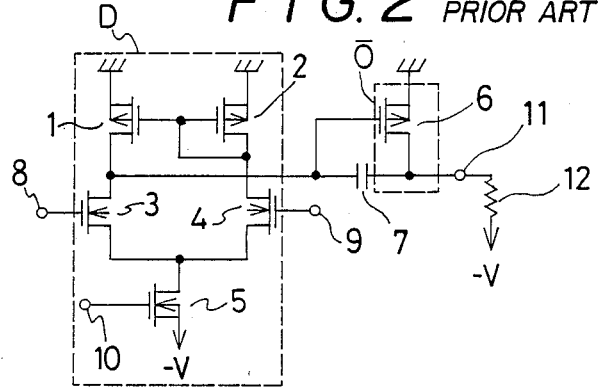
FIG. 2 is a circuit diagram of a conventional amplifier circuit.

Turning attention on FIG. 1, there is illustrated one embodiment of an amplifier circuit according to the present invention, which is employed as a buffer amplifier in a case where an objective signal in the form of a DTMF signal generated by a DTMF signal generator incorporated into a telephone system is transmitted to a telephone line. A buffer amplifier generally indicated at 20 includes: an active load type differential amplifying unit D having a pair of N-channel type load transistors 3 and 4; and a driver circuit O consisting of an P-channel type transistor 6 provided on the output side of the differential amplifying unit D. The differential amplifying unit D is connected via a transistor 5 functioning as a switching element to a power supply -V. The fundamental constitution of the buffer amplifier 20 is the same as the circuit constitution described in detail with reference to FIG. 2. In FIG. 1, the components corresponding to those shown in FIG. 2 are marked with the like symbols, and the description is therefore omitted herein.

In the buffer amplifier 20, a P-channel type switching transistor 22 is provided on the input side of the driver circuit O with the intention of eliminating instability in input level of the driver circuit O when the transistor 5 is turned OFF. A drain/source circuit of the switching transistor 22 is connected between the input of the driver circuit O and the earth or ground, while the gate thereof is connected to a terminal 10.

Inputted to the terminal 10 is a control signal C from a DTMF signal generator 21 for supplying an input terminal 8 with a DTMF signal S. The control signal C assumes earth or ground level only during the outputting of the DTMF signal but otherwise assumes −V level for other periods. Note that the input terminal 9 is connected to an output terminal 11, and the DTMF signal from the output terminal 11 is fed back.

Based on such a configuration, when the objective signal comprising DTMF signal S is outputted from the DTMF signal generator 21, the control signal C assumes earth level, so that the transistor 5 is turned ON. As a result, the operating electric current is fed from the power supply to the differential amplifying unit D. While on the other hand, the switching transistor 22 is turned OFF, and the input level of the driver circuit O is thereby allowed to vary in response to the output of the differential amplifying unit D. In consequence of this, it is possible to fetch a desired output from the output terminal 11 in response to the DTMF signal S.

When no DTMF signal S is outputted from the DTMF signal generator 21, the control signal C assumes $-V$ level. When the transistor 5 is turned OFF, the supply of the operating electric current to the differential amplifying unit D is halted. Futile consumption of the electric current is therefore restrained in the differential amplifying unit D. Simultaneously, the switching transistor 22 is turned ON, and the level of the input of the driver circuit O is clamped substantially to the earth level. Hence, even if the output level of the differential amplifying unit D comes into the floating state, the output of the driver circuit O is by no means unstabilized. At this time, the output of the terminal 11 is at the $-V$ level.

Figure 3:
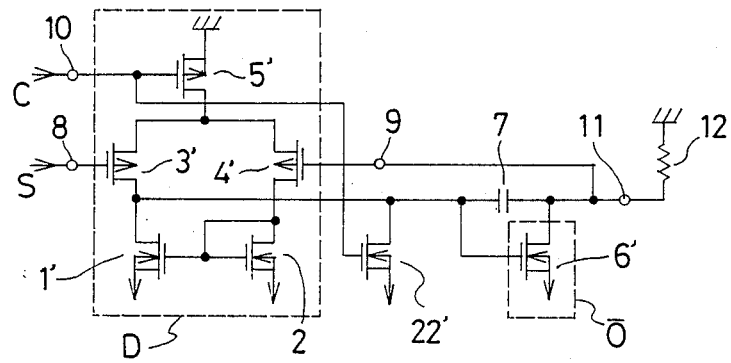
FIG. 3 is a circuit diagram depicting a variant form of the circuit shown in FIG. 1.

FIG. 3 shows a variant form of the buffer amplifier circuit 20 depicted in FIG. 1. The different point with respect to the buffer amplifier circuit illustrated in FIG. 3 is that the polarities of the respective transistors are opposite to those of the transistors shown in FIG. 1. The numerals each indicating the transistors in FIG. 3, which correspond to those of FIG. 1, are marked with ('). The function of the circuit depicted in FIG. 3 is the same as that of the circuit of FIG. 1.

In the foregoing embodiment, the description has been focused on one embodiment in which the present invention is applied to the circuit for buffer-amplifying the DTMF signal for the telephone system. The present invention is not, however, limited to the above-mentioned embodiment. The circuit to which the present invention is applied includes a function to amplify or buffer-amplify other various kinds of signals. Besides, the same effects can be obtained.

Namely, when the switching element is kept in the ON-state, the differential amplifying unit is supplied with the predetermined operating electric current from the power supply, while the clamping means does not function. The input level of the driver circuit varies in response to the output from the differential amplifying unit. A signal inputted to the differential amplifying unit is therefore outputted from the driver circuit.

On the other hand, when the switching element is kept in the OFF-state, no operating electric current is fed from the power supply to the differential amplifying unit, with the result that almost no electric power is consumed in the differential amplifying unit. In this case, the clamping means clamps the input level of the driver circuit to a predetermined level and holds the output of the driver circuit in a predetermined state, in spite of the fact that the output of the differential amplifying unit remains in a floating state.

In accordance with the present invention, it is feasible to certainly prevent the unstable state of the output level of the open drain type output circuit connected to the output of the differential amplifying unit even when stopping the supply of operating electric current to the differential amplifying unit. As a result, there is created no inconvenience to the amplifying process even in the case of turning ON/OFF the electric current of the differential amplifying unit for the purpose of saving the electric power consumed.

I claim:

1. An amplifier circuit comprising:
a signal generator operative during selected momentary periods for generating an objective signal and otherwise operative during other than the momentary periods for generating a control signal;
a differential amplifying device having active loads and being receptive of the objective signal from the signal generator to produce a corresponding amplified output signal;
an open drain type driver circuit having an input terminal receptive of the output signal from the differential amplifying device;
a power supply for supplying an operating current to the differential amplifying device;
a first switching device for switching off the operating current supplied to the differential amplifying device in response to the control signal from the signal generator, the first switching device being connected between the differential amplifying device and the power supply; and
a second switching device receptive of the control signal and operative according to the control signal to clamp a voltage level of the input terminal of the open drain type driver circuit to a predetermined voltage level.

2. An amplifier circuit according to claim 1; wherein the active loads, the second switching device, and the driver circuit comprise P-channel transistors, and the first switching device comprises an N-channel transistor.

3. An amplifier circuit according to claim 1; wherein the active loads, the second switching device, and the driver circuit comprise N-channel transistors, and the first switching device comprises a P-channel transistor.

4. An amplifier circuit according to claim 1; wherein the signal generator includes means for selectively producing an objective signal comprised of a DTMF signal.

* * * * *